United States Patent
Morris et al.

(10) Patent No.: US 6,472,295 B1
(45) Date of Patent: Oct. 29, 2002

(54) METHOD AND APPARATUS FOR LASER ABLATION OF A TARGET MATERIAL

(75) Inventors: James H Morris, Encinitas; Michael Powers; Harry Rieger, both of San Diego, all of CA (US)

(73) Assignee: JMAR Research, Inc., San Diego, CA (US)

( * ) Notice: Subject to any disclaimer, the term of this patent is extended or adjusted under 35 U.S.C. 154(b) by 0 days.

(21) Appl. No.: 09/385,676

(22) Filed: Aug. 27, 1999

(51) Int. Cl.[7] .................... H01L 21/46; H01L 21/78; H01L 21/301
(52) U.S. Cl. .................. 438/463; 438/33; 438/113; 438/940
(58) Field of Search .................. 438/33, 110, 113, 438/460, 461, 462, 463, 464, 465, 940; 219/121.6, 121.67, 121.71, 121.8

(56) References Cited

U.S. PATENT DOCUMENTS

| | | | |
|---|---|---|---|
| 4,943,700 A | * 7/1990 | Hughes et al. | ......... 219/121.67 |
| 5,454,808 A | 10/1995 | Koop et al. | |
| 5,593,606 A | * 1/1997 | Owen et al. | ........... 219/121.71 |
| 5,611,946 A | 3/1997 | Leong et al. | |
| 5,643,252 A | 7/1997 | Waner et al. | |

(List continued on next page.)

FOREIGN PATENT DOCUMENTS

JP 362104693 A * 5/1987 .............. 112/445

OTHER PUBLICATIONS

*Enhancements in materials–ease assembly and increase yield,* 3M Innovation (1996).
*Leading the Way in Chip–scale Technology,* advertising supplement, Flexible Circuits Engineering 20–25 (Jan.—Feb. 1997).
Chipscale International, *Join the Chipscale Revolution*(1997).
Vern Solberg, *Singulating Chip–Scale Packages,* Chip Scale Review 86–87 (Jul. 1998).
Texas Instruments Licenses Tessera's BGA Technology, Intel Selects BGA Package for Flash Memory Devices, JEDEC Committee Approves New Chip–scale Package Online (unknown date).

*Primary Examiner*—Michael Sherry
*Assistant Examiner*—Asok Kumar Sarkar
(74) *Attorney, Agent, or Firm*—Baker & McKenzie; John G. Flaim; William D. McSpadden

(57) ABSTRACT

A method and apparatus for laser cutting a target material is disclosed. The method includes the steps of generating laser pulses from a laser system and applying the laser pulses to the target material so that the laser pulses cut through the material. The laser pulses have an approximately ellipse shaped spot, have a temporal pulse width shorter than about 100 nanoseconds, and have an energy density from about 2 to about 20 times the ablation threshold energy of the target material. The laser pulses are applied to the material such that the major axis of the ellipse shaped spot moves parallel to the cutting direction. The spot has a leading edge and a trailing edge on the major axis, and the energy density of each laser pulse increases from zero to a maximum along the leading edge and decreases back to zero along the trailing edge. The apparatus is a laser system for cutting a target material that includes: a seed laser system for producing a first pulse laser beam; a laser amplifier for amplifying the first pulse laser beam to produce an amplified pulse laser beam; a harmonic generation system for converting the amplified pulse laser beam into a second pulse laser beam having a shorter wavelength; a focussing system for focussing the second pulse laser beam to an approximately ellipse shaped third pulse laser beam; and a motion control system for moving a target material contacted by the third pulse laser beam.

40 Claims, 6 Drawing Sheets

U.S. PATENT DOCUMENTS

| | | |
|---|---|---|
| 5,663,106 A | 9/1997 | Karavakis et al. |
| 5,742,634 A * | 4/1998 | Rieger et al. .................. 372/25 |
| 5,776,796 A | 7/1998 | Distefano et al. |
| 5,790,574 A | 8/1998 | Rieger et al. |
| 5,848,080 A | 12/1998 | Dahm |
| 5,866,949 A | 2/1999 | Schueller |
| 5,870,421 A | 2/1999 | Dahm |
| 5,948,172 A | 9/1999 | Neiheisel |
| 6,002,697 A * | 12/1999 | Govorkov et al. ............ 372/34 |
| 6,009,110 A * | 12/1999 | Wiechmann et al. ......... 372/10 |
| 6,021,154 A1 * | 2/2001 | Unterenahrer ............. 372/108 |
| 6,208,458 B1 * | 3/2001 | Galvanauskas et al. ..... 359/345 |
| 6,246,026 B1 * | 6/2001 | Vergeest ................ 219/121.72 |

* cited by examiner

METHOD AND APPARATUS FOR LASER ABLATION OF A TARGET MATERIAL

FIELD OF THE INVENTION

This invention relates to lasers and, in particular, to a method and an apparatus for employing laser light to generate high precision through-cuts in a target material. The apparatus and method are particularly useful in singulating multi-element semiconductor substrates for the purpose of separating the semiconductor elements.

BACKGROUND OF THE INVENTION

Laser devices have been used to cut various materials for some time. Disadvantages of such devices in the cutting process are known. For example, the cut quality (surface smoothness) has been less than desirable, and resolidified material has had a tendency to accumulate on the surface cut. The lack of available precision laser cutting methods has been particularly troublesome in the semiconductor packaging industry.

With the increased miniaturization of electronic devices, there has been widespread interest in semiconductor packages that occupy a minimum amount of space. Various methods have been developed that allow semiconductor dies to be encapsulated in packages that are no larger or only slightly larger than the periphery of the semiconductor chip. For example, U.S. Pat. Nos. 5,663,106 and 5,776,796 disclose methods of semiconductor die encapsulation that are used to produce what are known as chip-size or chip-scale semi-conductor packages. In these methods, a number of semiconductor dies are placed on a substrate and a flowable encapsulation material is deposited around the semiconductor dies. The encapsulation material is allowed to cure and the semiconductor dies are then separated (singulated) from each other to form a number of chip-size or chip-scale semi-conductor packages.

Various methods have been used to singulate, i.e. cut-out, the semiconductor devices such as die punching, sawing, rotary knife cutting, water jet cutting and laser cutting. While each of these methods may provide satisfactory results in certain situations, precisely uniform semiconductor device singulation has proven to be an elusive goal. The lack of precision singulation techniques has become particularly troublesome in that the electronic device industry has proposed new standards for the acceptable variation in the outline dimensions of chip-scale semiconductor packages.

There are several other chip singulation needs in the semiconductor industry. The most common are the separation of individual circuit elements that have been lithographically printed or otherwise generated on substrates such as silicon, gallium arsenide, several forms of ceramic, or silicon-on-insulator laminates where the insulator is glass, quartz, or sapphire. In this area, precision device singulation has also been difficult to attain.

In view of the foregoing, it is apparent that there is a continued need in the semiconductor industry for a chip-scale singulation method and apparatus that provides high quality, precision cuts at an economically viable cutting rate. Particularly, there has been continued interest in laser cutting techniques that may be used to precisely singulate semiconductor devices in conformity with increasingly tight industry standards for semiconductor device outlines.

Laser-based micromachining techniques have been applied in the semiconductor device industry in the past. For instance, U.S. Pat. No. 5,593,606 discloses a method and apparatus for forming circular shaped vias, both through and blind, in multi-layered semiconductor materials such as a printed wiring board. The '606 patent describes a method utilizing ultraviolet laser light to ablate layered materials of different chemical compositions using a circular laser spot. The '606 patent states an advantage of its apparatus and method as elimination of a saturation limit on the power density ablation rate per pulse. The '606 patent explains that the "saturation depth of a cut per laser pulse is reached when an increase in power density of the beam pulse striking the target does not produce an appreciable increase of depth of cut into the target [and] [t]his is especially true for the excimer laser because the use of a beam-shape controlling mask dictates that the beam spot area equal the spatial area defined by the via to be cut." The '606 patent also notes that it is believed the saturation depth phenomenon is caused by "development by the first beam pulse of a debris plume that acts as a filter or mask for subsequent beam pulses.

This known apparatus and method suffers a number of disadvantages. For example, by using a circular spot, cut roughness can increase. Another disadvantage is a saturation limit on the energy density ablation rate per pulse. If the energy of each individual pulse applied to the intended ablation volume (defined by the spot area and absorption depth) is less than the energy needed to vaporize the material, little or no ablation will occur. On the other hand, if the pulse energy is substantially greater than the energy needed by the ablation volume for vaporization, the excess energy is dissipated as heat or is otherwise not used for material removal. Either way, ablation efficiency is relatively low.

It has been discovered in the present invention that this effect can be minimized by using laser pulses with energy approximately matching the energy requirement for complete vaporization of the intended ablation volume. For a given material and laser wavelength, there is an optimum energy density whereby the ablation efficiency is maximized. Since the spot size in the method and apparatus of U.S. Pat. No. 5,593,606 is stated to be less than about 50 micrometers in diameter, optimum ablation efficiency would be achieved only if the pulse energy was very low. Since cutting rate is generally proportional to average power of the laser, high throughput would require a large laser repetition rate.

Another limitation on laser ablation is a requirement on the minimum intensity of the laser pulse. Although the pulse may have sufficient or optimum energy content, it can not be efficiently used for vaporization if the time of application (pulse width) is too long, that is, long compared to the characteristic thermal diffusion time of the material. Generally, the pulse width must be short enough such that thermal diffusion into the material is minimal.

Accordingly, there is a need for a laser cutting system and method that provides laser pulses of optimum energy and duration such that efficient ablation can occur resulting in effective cuts. The average power requirement and hence, cost, of such a device would be minimized.

SUMMARY OF THE INVENTION

The present invention alleviates to a great extent the disadvantages of the known apparatus and methods for forming through cuts in target materials by providing, in one embodiment, a laser system that amplifies and increases (such as tripling) the frequency of the output of a seed laser subsystem with one or more stages of amplification to generate ultraviolet light output pulses. These pulses are focused into an elongated orientation, such as preferably a line or ellipse with an optical focusing apparatus such as a cylindrical lens pair. The elongated, elliptical or line focus is projected onto the surface of the target material to be cut. The target material is moved in the same direction as the elongated focus, such as substantially parallel to the line focus in the preferred embodiment, to create a continuous through-cut. The lenses can be rotated and the material motion direction can be varied to allow cutting along any direction parallel to the plane of the target material.

The laser beam is focussed to an illumination area (also referred hereafter as a "spot") shaped and dimensioned to include a major axis and a minor axis and preferably, the laser pulses are applied to the material such that the major axis of the illumination area moves or is moved parallel to the cutting direction. The illumination area also has a leading edge and a trailing edge on the major axis, and the energy density of each laser pulse increases from zero to a maximum along the leading edge and decreases back to zero along the trailing edge. The pulse energy of the laser pulses is selected to exceed the ablation energy density required for the material to be cut. In other words, the pulse energy selected is based on the ablation threshold energy of the target material and the area of the illumination area. In a preferred embodiment, the pulse energy is greater than about 5 microJoules, preferably is between about 0.1 milliJoules and about 250 milliJoules, although it should be understood that other energy levels can be selected.

When this method and apparatus are used in semiconductor packaging, the method and apparatus allow for the complete singulation of individual semiconductor elements, which often are rectangular (or square) and need to be cut on all four sides, although it should be recognized other shape cuts can be generated. In the preferred embodiment, the method and apparatus produces singulated semiconductor devices having tight dimensional control on the device outline as required by electronic device industry standards.

In the method of the present invention, the target material is cut. The steps of making a cut include generating laser pulses from a laser system and applying the laser pulses in a cutting direction to the target material so that the laser pulses cut through the target material. The laser pulses preferably have a line focus or an approximately ellipse shaped spot, have a pulse duration sufficiently short to minimize thermal diffusion, have an energy density sufficiently above the ablation threshold of the material being cut to ablate efficiently, and a repetition rate sufficient to achieve a desired cutting rate. In a preferred embodiment, the temporal pulse width is shorter than about 100 nanoseconds, and the energy density is between about 2 to about 20 times the ablation threshold energy of the target material. Any suitable repetition rate may be selected to achieve the desired cut rate and depth. In a preferred embodiment, the laser pulses have a repetition rate greater than about 50 Hz, and most preferably have a repetition rate between about 100 and about 1500 Hz.

In one embodiment of the invention, the laser system includes: a seed laser system for producing a first pulse laser beam; a laser amplifier for amplifying the first pulse laser beam to produce an amplified pulse laser beam; a harmonic generation system for converting the amplified pulse laser beam into a second pulse laser beam having a shorter wavelength; a focussing system for focussing the second pulse laser beam to an approximately ellipse shaped third pulse laser beam; and a motion control system for moving a target material contacted by the third pulse laser beam. Preferably, the focussing system includes two lenses. The first lens controls the length of the major axis of the approximately ellipse shaped third pulse laser beam and the second lens controls the length of the minor axis of the approximately ellipse shaped third pulse laser beam. The motion control system includes two orthogonal stages capable of moving the target material in any direction parallel to a surface plane of the target material.

One advantage of the present invention is that a cost-effective laser system and method is provided to form high quality through cuts in target materials, especially target materials used by the semiconductor industry.

Another advantage of the invention is that a laser cutting system and method that optimizes the energy density on the material and have a sufficiently short pulse duration such that ablation efficiency is maximized is provided.

The method and apparatus of the present invention also has other advantages, which should be apparent to one skilled in the art. By way of example, the proper selection of the width or, preferably, the length of the line focus can optimize the energy density. This allows the use of higher pulse energy lasers, which would be inefficient if the maximum spot dimension was constrained to a 50 micrometer diameter or less. Another advantage of the present invention is that for a specific average power, lower pulse repetition rate can be used because of the utilization of higher pulse energy.

Another advantage of the present invention is that the probability of shock damage is reduced because of operation at low energy density and because of energy density tapering at the leading and trailing edges of the cutting laser spot.

A further advantage is that by moving the line focus along its length, cuts are very straight with little width variation. A fifth advantage is that by using a high beam quality, high brightness laser, the volume of the cut and the amount of debris generated from the ablation is minimized.

These and other features and advantages of the present invention will be appreciated from a review of the following detailed description of the invention, along with the accompanying figures in which like reference numerals refer to like parts throughout.

It should be understood that the figures are not necessarily drawn to scale and that the embodiments are sometimes illustrated by graphic symbols, phantom lines, diagrammatic representations and fragmentary views. In certain instances, details that are not necessary for understanding the invention or which make other details difficult to perceive may have been omitted. It should be understood, of course, that the invention is not necessarily limited to the particular embodiments illustrated herein.

DETAILED DESCRIPTION OF THE INVENTION

Figure 1:
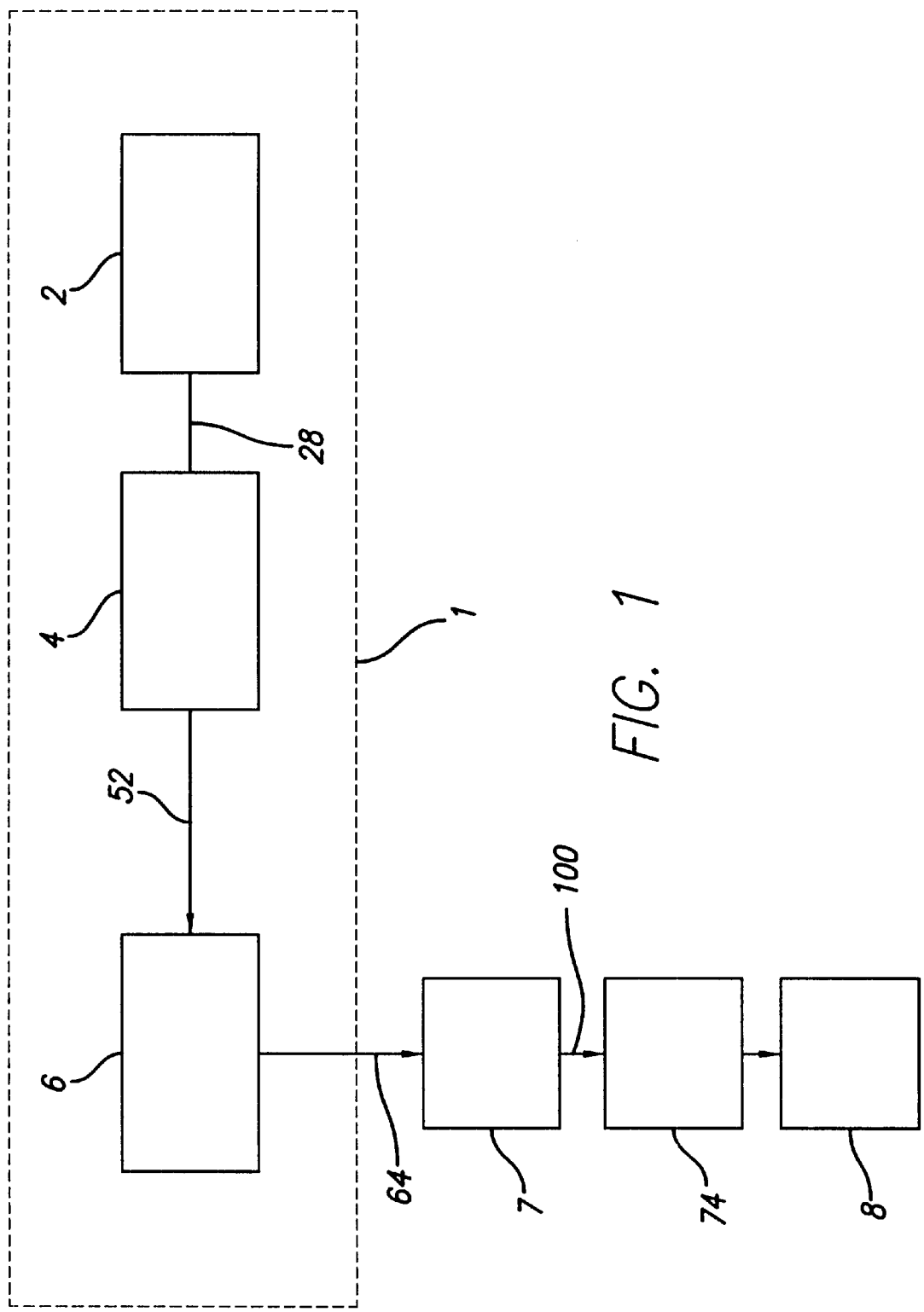
FIG. 1 is a schematic diagram of a laser system in accordance with the present invention.
Figure 2:
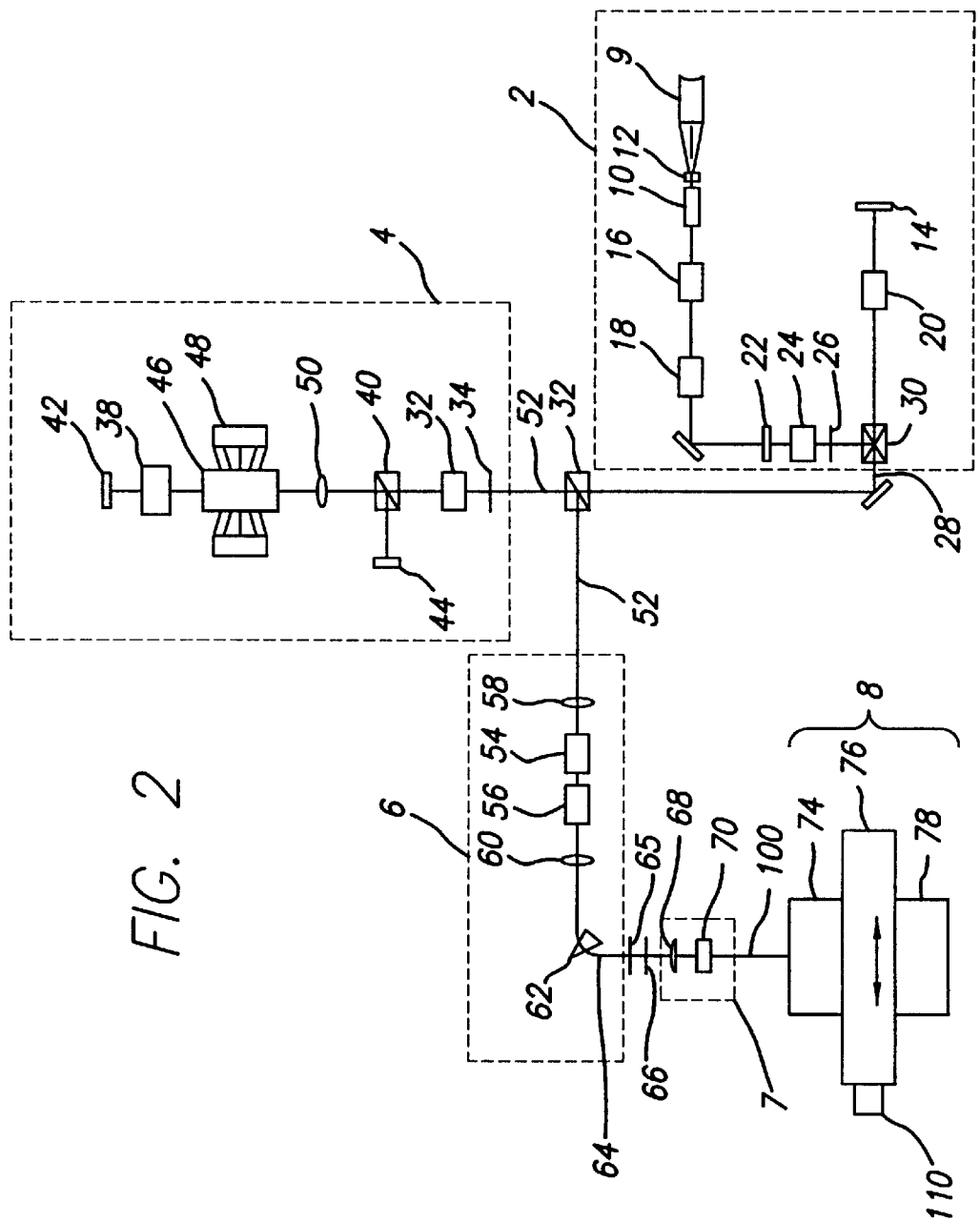
FIG. 2 is a schematic diagram of an embodiment of a laser system in accordance with the present invention.

Preferred embodiments of a system in accordance with the present invention are illustrated in FIGS. 1 and 2. The system includes a laser system 1, which optionally includes a master oscillator 2 (also referred to as "seed laser system"), a laser amplifier 4, a harmonic generation system 6. It should be understood that any arrangement of laser system 1 can be used such as for example, an excimer, Ti:Sapphire, copper vapor, diode pumped solid state, flashlamp pumped solid state (for example a flashlamp pumped Nd:YAG laser) and so on. The system also includes a focussing system 7 including lenses 68 and 70, and a motion control system 8.

Any seed laser system or master oscillator 2 may be used which can generate a suitable output beam 28 of a desired energy level and wavelength to act as a seed beam for ultimately cutting the target material in the desired fashion. In one embodiment, the seed laser system includes a laser diode 9 that pumps a laser rod 10 through a dichroic mirror 12 to generate optical gain. Mirrors 12 and 14 form a resonate cavity around laser rod 10. An acousto-optic Q-switch 16, an acousto-optic mode-locker 18, an electro-optic cavity dump 20 and an etalon 22 represent intracavity components that define the characteristics of the output beam 28. Faraday rotator 24 and quarter-wave plate 26 rotate the polarization of the intracavity radiation when the cavity dump 20 is activated to allow the energy to escape through polarizing beam cube 30. The master oscillator 2 produces approximately 1 mJ laser pulses with duration of between 0.2 and 1.5 nanoseconds. The pulse repetition rate is adjustable up to approximately 1,500 Hz. The master oscillator 2 generates a single-mode, polarized laser beam, with a spatial mode that is substantially $TEM_{00}$ with a substantially guassian spatial distribution. The laser rod 10 within the seed laser system 2 is preferably a Nd:YAG crystal resulting in a output wavelength of approximately 1064 nanometers.

The output beam 28 from the seed laser system 2 optionally passes through one or more stages of amplification. Any suitable amplification system may be used, which will result in an output beam of sufficiently high energy density for ablation of the target material at a desired rate and depth. The amplification system is illustrated diagrammatically with box 4 in FIG. 1 and with the dotted lines labeled as element 4 in FIG. 2. In FIG. 2, the amplifier 4 illustrated is an exemplary single stage laser amplifier.

The output laser beam 28 may go directly to the amplifier 4 from the master oscillator 2, as illustrated in FIG. 1, or optionally may be directed using mirrors, splitters or other beam directing apparatus in any desired fashion. In the embodiment illustrated in FIG. 2, the output beam 28 passes through a polarizing beam splitter 32 into the diode-pumped laser amplifier 4, as illustrated in FIG. 2. The amplifier uses a wave plate 34, Faraday rotators 36 and 38, a polarizing cube 40, and mirrors 42 and 44 to permit the beam to pass four times through the amplifier laser rod 46, which is pumped by laser diodes 48.

Thermal lensing, often associated with high average power gain media, as in the illustrated preferred embodiment, can be substantially corrected for by using an optional compensating spherical lens 50. The polarization of the output from the amplifier is rotated 90° from the input, hence the amplified beam 52 is reflected from the polarizing beam splitter 32 rather than transmitting through it, thereby directing the beam in a desired fashion.

In the illustrated preferred embodiment, the amplified beam 52 then proceeds to harmonic generator 6. Any suitable harmonic generator 6 may be used in order to process amplified beam 52 to a desired wavelength. Any wavelength may be selected so long as it is suitable for ablating the target material. Alternatively, no harmonic generator 6 may be used, so long as the amplified beam 52 from the amplification system 4 is at the desired wavelength. In an embodiment in which no amplification system 4 is used, a harmonic generator 6 optionally may be used to receive and process output beam 28. Alternatively if output beam 28 is already at a desired frequency, then a harmonic generator 6 is not required as well.

In the preferred embodiment illustrated in FIG. 2, the amplified beam 52 passes through a non-linear crystal 54, preferably type I LBO, and is partially converted to the second harmonic at 532 nanometers. The second harmonic and the residual fundamental wavelength then pass through a second non-linear crystal 56, preferably type II LBO, which mixes the two wavelengths to generate the third harmonic at 355 nanometers. To increase the frequency conversion efficiency, an optional lens 58 can be used to reduce the beam size through the non-linear crystals 54, 56 thereby increasing the intensity and conversion efficiency. A second lens 60 can be used to re-collimate the beam after conversion. The beam is then passed through a prism 62 to separate the desired third harmonic from the residual second harmonic and fundamental in the illustrated embodiment. The 355 nanometer output beam 64 will substantially retain the beam quality, spatial mode and polarization characteristics of the master oscillator output beam 28, however, its spatial profile will be steepened somewhat because of the non-linear character of the conversion crystals. Typically, a gaussian input profile will become a super-gaussian profile after frequency conversion in the harmonic generation system 6. Although a gaussian beam profile is preferred, it should be understood that any other suitable beam profile may be used. In addition, it should be understood that although a 355 nanometer wavelength is selected in the illustrated embodiment, any other suitable wavelength may be used. However, it is preferred to use the 355 nanometer wavelength for output beam 64 when the target material is a semiconductor element to be singulated.

The output beam 64 then passes through a beam delivery system 7. Any focusing and beam processing elements may be used that will achieve a shaped and focused beam having the desired beam energy density, shape and polarization orientation. In the illustrated preferred embodiment, this system includes a polarization rotator 65 to optimize the polarization direction relative to the cutting direction or major axis of the illuminated area, an electronically controlled, high-speed shutter 66, and focusing optics comprising two orthogonal aligned cylindrical lenses 68 and 70.

Figure 3:
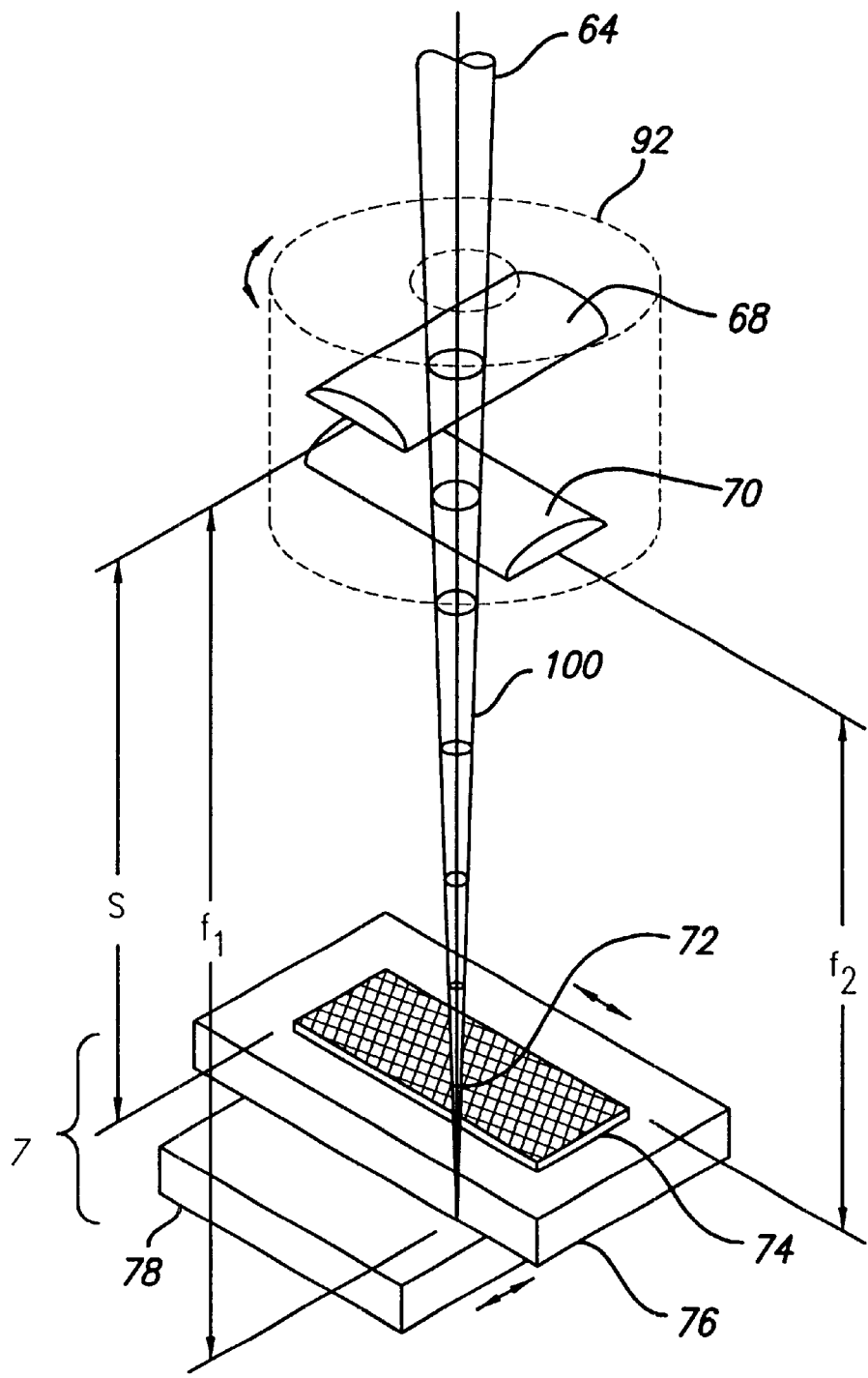
FIG. 3 is an expanded view of the optical and motion layout of a laser system in accordance with the present invention.

Details of a preferred embodiment of the focusing elements are shown in FIG. 3 and the resultant focused beam 100 and its properties, having a line focus at the target 74 are illustrated in FIGS. 4A–D. The first cylindrical lens 68 establishes the length ("L") of the major axis 80 of the line focus 72. The distance, s, from the lens to the surface of the target material 74 to be cut is less than the focal length, $f_1$. This creates a desired length ("L") of the major axis 80 of the line focus 72 at the target material 74, depending on the depth within the material of the focal length distance from the lens 68. The line focus major axis 80 length is higher if the depth of the focal point is further into the target material 74, than if it is closer to the surface the target material 74. The depth of the focal point can be selected to adjust the length of the line focus major axis 80, as well as the energy density of the beam. The major axis 80 length will be approximately equal to $(1-s/f_1)$ times the diameter of beam 64 entering the first lens 68.

Since the major axis of the beam at the target material 74 is within the near-field of the first cylindrical lens 68, its spatial profile will substantially follow the profile of the beam 64 entering the first lens 68. The second cylindrical lens 70 in the preferred embodiment defines the line width ("W") of the minor axis 82. This lens 70 is aligned substantially 90° from the first lens 68 and its distance to the material surface is approximately equal to its focal length, $f_2$, putting the minor axis 82 in the far-field of the second lens 70. For a near-diffraction limited beam, the line focus width, i.e. the width ("W") of the minor axis 82 is approximately equal to the product of the wavelength of the light and the number of the second lens. The depth of field will be approximately equal to twice the wavelength times the square of the f-number. Both lenses are optionally mounted on a rotational stage 92 to permit the alignment of the line focus with any axis on the surface 75 of the material 74. Both lenses can also be optionally mounted on a vertical motion stage to allow fine-tuning of the focus on the surface. Optionally, the first lens 68 is mounted to a second vertical motion stage to allow independent adjustment of the line focus length.

In order to make a longer cut in the target material 74 than the length of the major axis 80, it is desired to translate the target material 74 and the focussed beam 100 in relation to one another. In the preferred and illustrated embodiment, the target material is translated and the beam 100 remains generally stationary, i.e. it is not scanned. Alternatively, the beam may be scanned using any suitable scanning technique and the target material 74 may be held stationary. Alternatively both the beam 100 may be scanned and the target material may be translated.

In the illustrated embodiment, motion control system 8 is provided for moving the target material 74. Any suitable motion control system may be provided which moves the target material at the desired rate of speed and in the desired directions. In the illustrated embodiment, the target material 74 is mounted to two, orthogonal translation stages 76 and 78 that permit the target material 74 to move in any direction in a plane (i.e. in x- and y-directions). Alternatively, the apparatus may be provided to vertically translate the target material 74, i.e. providing translation in the z-direction. The speed and direction preferably controlled by synchronization of the stage motion by a computer control system 110. The computer control system 110 is illustrated as attached to one of the stages 76, but it should be understood that it may be at any location sufficient to control the motion control system 8 in the desired fashion. The computer control system can also adjust the polarization rotator 65 such that the polarization vector of focussed beam 100 is optimized with respect to the cutting direction or major axis of the spot.

Optionally, an intelligent vision system can be used to view both the laser beam (or target material fluorescence induced by the laser beam) and fiduciary points on the target material and to command the motion systems to properly align the focus to the fiduciaries. The depth of field of the line focus is approximately equal to or greater than the thickness of the target material to be cut.

Figure 4B:
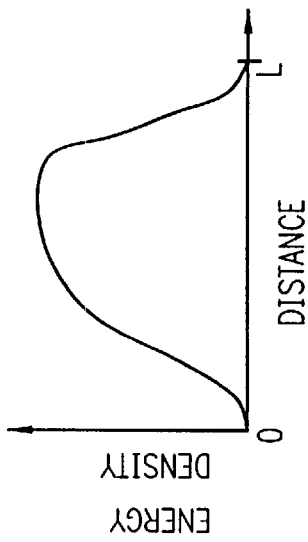
FIG. 4B is an illustration of an exemplary energy density profile taken along the major axis of the line focus beam profile illustrated in FIG. 4A.
Figure 4C:
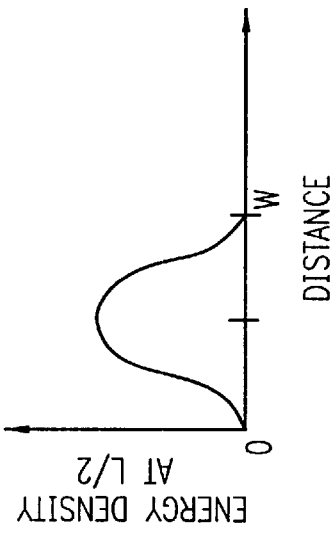
FIG. 4C is an illustration of an exemplary energy density profile taken along the minor axis of the line focus beam profile illustrated in FIG. 4A.
Figure 4A:
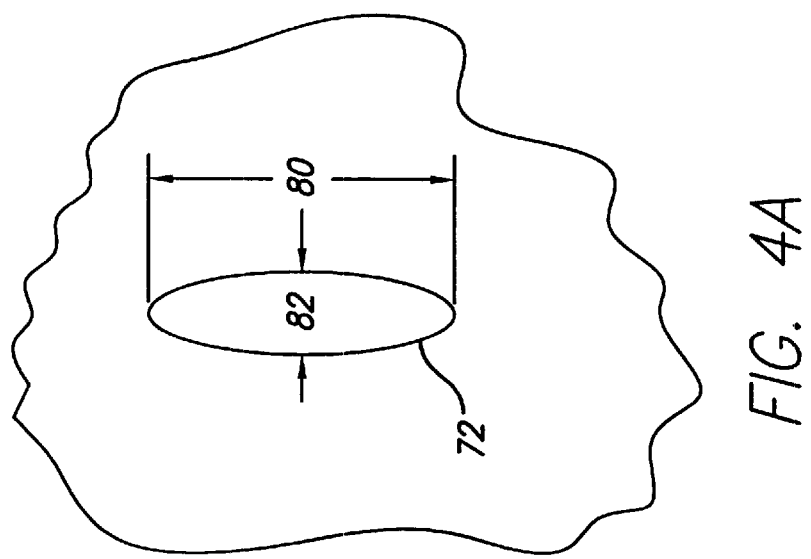
FIG. 4A is an illustration of an exemplary line focus beam profile in accordance with the present invention.
Figure 4E:
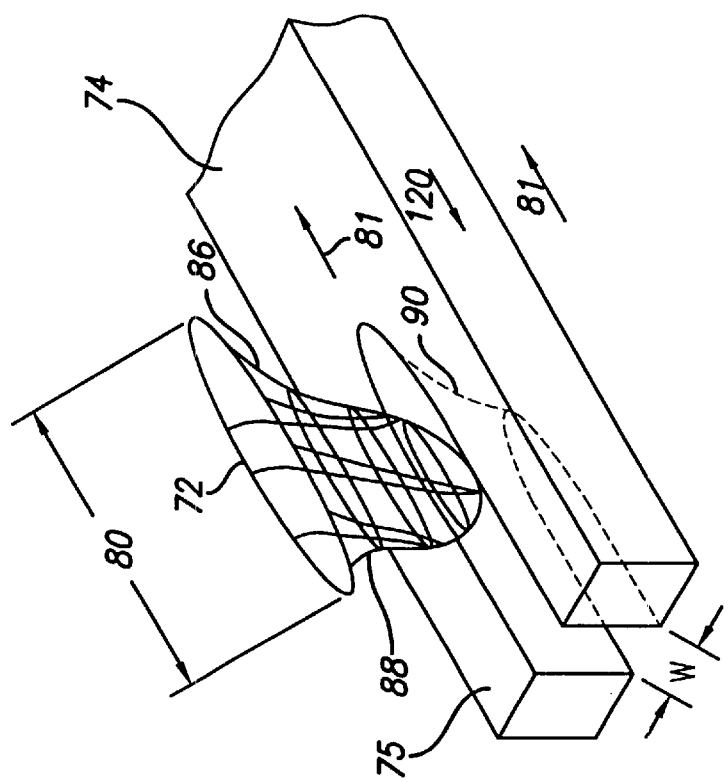
FIG. 4E is an illustration of an exemplary cut made in a target material in accordance with the apparatus and method of the present invention, showing a three dimensional view of the laser line focus.
Figure 4D:
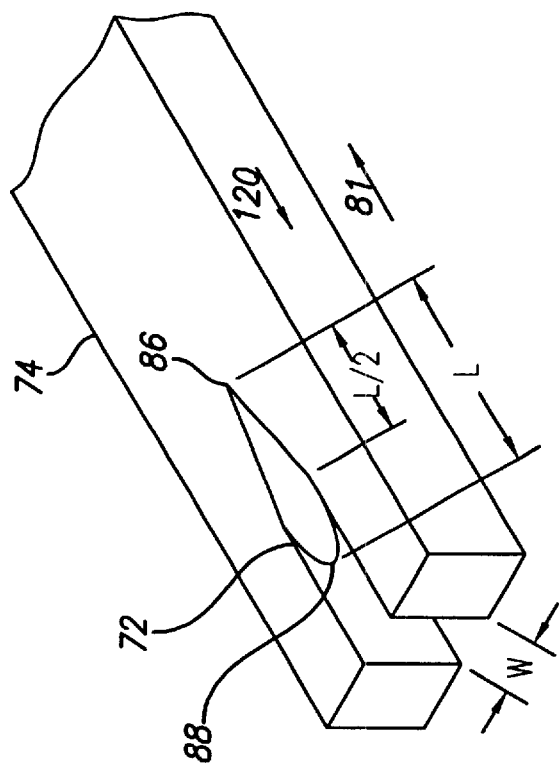
FIG. 4D is an illustration of an exemplary cut made in a target material in accordance with the apparatus and method of the present invention, showing a cross section of the laser line focus.

FIGS. 4A–4E illustrate exemplary geometry and energy characteristics of the focused beam 100 and the cutting process. The spatial profile 72 (i.e. the "line focus") of the focused beam 100 is shown in FIG. 4A. The spatial profile 72 preferably has a substantially elliptical shape, having major axis 80 with length L and a minor axis 82 with maximum width W (preferably located in the middle of the major axis, i.e. at L/2). The width and length of the spatial profile are defined at the lateral and longitudinal limit of material ablation, i.e. where the energy density is at the ablation threshold of the material being cut. The preferred energy density profile is illustrated in FIGS. 4B and 4C. Along the major axis, this profile is preferably approximately super-gaussian, as illustrated in FIG. 4B and the energy profile approximately gaussian along the minor axis 82, as illustrated in FIG. 4C. The cut produced by moving the focus along its major or long axis is also illustrated in FIGS. 4D and 4E. Line focus 72 moves in cutting direction 81 relative to the material surface. This can be achieved using the tables 76 and 78 to translate the target material 74 in a direction opposite of the cutting direction, illustrated with arrow 120.

During the cutting process, it is seen that the width of the cut is approximately W, the width of the minor axis of the line focus 72 at its widest point. The width of the cut starts at zero at the leading edge 88 of the line focus 72 and increases until it is W. The depth of the cut during the passage of the laser line focus gradually increases from zero then preferably penetrates the material 74 just before the focus has past.

The parameters of the processing beam 64 preferably are selected to optimize the average energy density (energy per unit area) on the target material to approximately 2 to 20 times the ablation threshold energy of the target material and more preferably to approximately 10 times the ablation threshold energy level. It should be understood however, that any energy density on the target material may be selected so long as it exceeds the ablation threshold energy, and the practicing of the present invention is not restricted to the preferred energy density ranges. It is also preferred to avoid excessive thermal diffusion into the target material 74 to avoid peripheral damage of the material. In order to avoid excessive thermal diffusion, it is preferred to use a temporal pulse widths shorter than about 100 nanoseconds, and more preferably shorter than about 40 nanoseconds, or even shorter than about 2 nanoseconds.

In the preferred laser singulation embodiment, the width W of the line focus 72 is preferably selected to be under approximately 125 micrometers, and more preferably between 10 and 50 micrometers, and the ratio of length to width (major axis to minor axis) is preferably selected to be 4 or greater. Again, other dimensions can be selected as well, so long as the desired energy distribution profiles within the line focus 72 can be achieved. When the laser system is used to singulate semiconductor chips, the maximum length ("L") of the line focus is preferred to be less than about 2 centimeters which is characteristic of typical chips to be singulated, although any other length L can be selected.

The energy density along the major axis 80 of the line focus 72 at the leading and trailing edges 86, 88 is selected to rise to the maximum level over a specific distance. Preferably, the energy distribution varies smoothly from 10% to 90% of the maximum level over a distance that is at least equal to the width W of the minor axis 82 of the line focus 72.

Good beam quality and high brightness also are preferred since this allows higher aspect ratio (width to depth) cuts which result in minimizing both the amount of material needed to be removed and the amount of undesirable debris generated.

The pulse energy is selected, based on the target material ablation threshold and the area of the line focus 72. In the preferred embodiment, the pulse energy level is greater than about $5 \times 10^{-6}$ Joules, and more preferably between 0.1 mJ and 250 mJ, although any energy level sufficient to achieve an energy density that can achieve ablation of the target material may be selected.

The repetition rate of the laser is preferably greater than about 50 Hz, and more preferably between 100 and 1500 Hz. although any repetition rate may be selected that can achieve the desired cut.

The laser wavelength can be selected for good absorption, depending upon the particular target material to be cut. Material absorption is also dependent on temporal pulse width. For pulse widths greater than about 2 nanoseconds, the wavelength is preferably less than about 400 nanometers. For pulse widths between about 100 picoseconds and 2 nanoseconds, the wavelength is preferably less than about 600 nanometers, and for pulse widths less than about 100 picoseconds, the wavelength is preferably less than about 1100 nanometers.

In the motion control system 8, the translation stages 76, 78 supporting the target material 74 to be cut preferably move the target material parallel to the major or long axis 80 of the line focus 72 at a constant speed that just allows the penetration of the cutting beam through the target material 74. Optionally, the target material can be held stationary until the beam first penetrates, then the translation stages can be moved to a new cutting location while the beam is shuttered off, producing discrete cuts, that optionally can overlap, creating a longer cut.

In operation, a target material 74 is provided and mounted in a desired fashion on a motion control system 8. A laser beam having desired properties, such as frequency, pulse width and energy density, is generated by a laser beam system 1, generating beam 64. Optionally, the illustrated laser beam system may be used, including using master oscillator 2, laser amplifier 4 and harmonic generation system 6. The beam 64 is then focused in a desired fashion to form a so-called line focus, i.e. a generally elliptically shaped output beam 100. The dimensions of the line focus 72 of the shaped output beam 100 are selected using a focusing system 7. The target material 74 is moved in a desired fashion, resulting in a cut pattern corresponding to the motion of the target material 74. As the target material is cut, it is noted that the energy density profile preferably has a super-gaussian profile along the major axis, as illustrated in FIG. 4B, and a near-gaussian profile along the minor axis, as illustrated in FIG. 4C, leading to a relatively clean and desirable cut in the target material 74. Rough edges and spots can be avoided.

Generally, the laser-material interaction is performed in air. Optionally, the interaction zone can be flushed with gas such as Helium or Argon during the cutting operation to actively remove debris, to cool the surface, and/or to change the gas breakdown characteristics of the laser pulse at focus.

Figure 5:
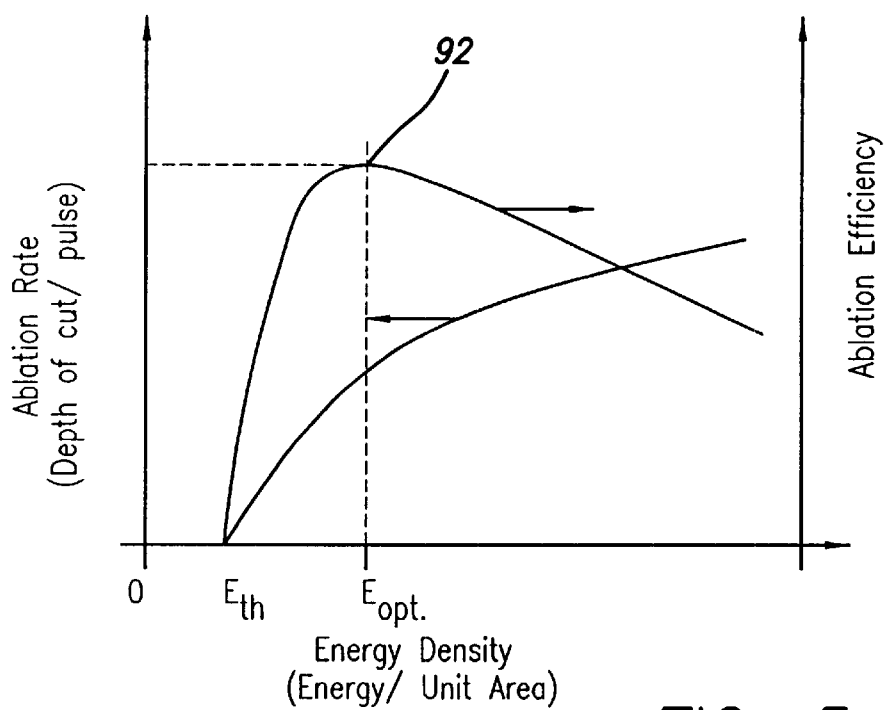
FIG. 5 is a graphical depiction of ablation rate and ablation efficiency versus pulse energy density in accordance with the laser system of the present invention.

One benefit of the present invention is the ability to set the energy density to a value that optimizes the ablation efficiency without limiting the pulse energy. FIG. 5 illustrates the general variation in ablation rate and ablation efficiency as a function of energy density for materials where the ablation mechanism is photo-thermal. At a low energy density, the pulse contains insufficient energy to satisfy the heat of vaporization, hence, negligible ablation occurs. At the threshold energy density ($E_{th}$) and above, the pulse does contain enough energy, and ablation rate (in terms of ablation or cut depth per pulse) rises in proportion to the energy density. However, substantially above the threshold energy density, the pulse contains an excess of energy, part of which ablates and the residual is generally lost to heating laterally or beneath the ablation zone or to absorption by a plasma formed by the leading edge of the pulse. This is seen in the graph as a saturation of the ablation rate at higher energy densities. This effect is not related to the power density saturation effect described in U.S. Pat. No. 5,593,606, which relates to power saturation due to debris from previous pulses. The second curve illustrates the ablation efficiency in terms of the ratio of the volume of the material ablated (cut depth times the focus spot area) to the laser pulse energy. Generally, the optimum efficiency 92 is obtained when the energy density is at $E_{opt}$, which is between 2 and 20 times the ablation threshold energy ($E_{th}$).

Figure 6:
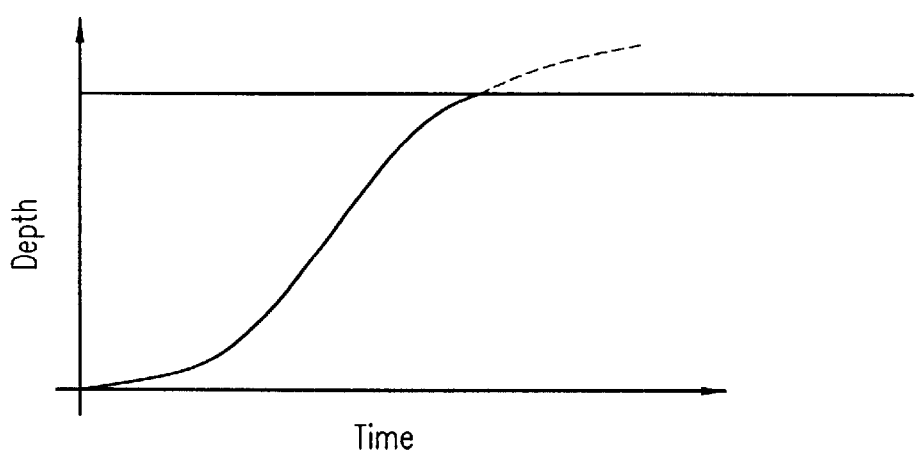
FIG. 6 is a graphical depiction of cut depth versus elapsed time in accordance with the laser system of the present invention.

Another benefit of the present invention is the high quality of the cut. It has been observed that the present invention yields a consistently clean entrance and exit of the cut, very smooth and straight sidewalls with no evidence of shock damage, and very little permanent debris adjacent to the cut. FIG. 6 shows the observed profile of the cut depth along the major or long axis of the cutting line focus. The slope of the depth gradually increases from zero, reaching a maximum slope approximately one-third of the way through, then tapers off as the full thickness is cut. It is believed that the reason for clean, entrance and exit is the tapering of the energy density in the leading and trailing edges of the line focus. This cuts through the upper and lower surfaces with lower energy density than the central portion of the material, which it is believed further reduces the probability of shock damage often seen at the material boundaries. Very smooth and straight cut edges are also seen in the samples cut with a line focus. It is believed that the high quality edge profiles are a result of using a moving line focus, which tends to smooth out both spatial and temporal intensity variations in the cutting beam. Furthermore, the low levels of debris are believed to be a result of operating at optimum ablation efficiency and using a cutting beam with good beam quality and high brightness, which allows generating high aspect ratio cuts, hence minimum material removal.

Having described the method and apparatus of the present invention, the invention is further illustrated in the following Examples, which are intended as exemplifying the invention and are not intended to be taken as limiting. Even though the apparatus of the present invention has been tested on semiconductor materials, the method and apparatus would be effective in cutting other target materials.

EXAMPLE 1

Multi-layer (laminate) substrates containing ball grid array semiconductor elements requiring singulation were cut. Table 1 below summarizes data collected in these operations using a Model BL-1010-T laser, which combines the master oscillator 2, the laser amplifier 4, and the harmonic generator 6 into a single system, a Model 2000 system for the motion control system 8. Both the Model BL-1010-T laser and the Model 2000 motion control system are from JMAR Technologies, Inc., San Diego, Calif. Also used was a focussing system 7 comprising two cylindrical lenses 68 and 70 available from CVI Laser Corp. of Albuquerque, N. Mex. The target material substrates in this example contained three layers which include a polyimide layer about 50 micrometers thick, an intermittent copper layer that is of about 20 micrometers thick, and an elastomeric epoxy layer in varying thicknesses from 250 micrometers up to 580 micrometers but averaging about 520 micrometers thick in the substrates tested.

TABLE 1

| Wavelength (nm) | Pulse Energy (mJ) | Pulse Duration (nsec) | Rep Rate (Hz) | Focus Size ($10^{-6}$ m) | Energy Density (J/cm$^2$) | Cut Rate (mm/sec) | Cut Rate Per Watt (mm/sec/W) |
|---|---|---|---|---|---|---|---|
| 355 | 5.0  | 1 | 60  | 50        | 250 | 0.051 | 0.17 |
| 355 | 1.67 | 1 | 60  | 50        | 84  | 0.025 | 0.25 |
| 355 | 0.67 | 1 | 300 | 36 by 730 | 3.2 | 0.28  | 1.40 |
| 532 | 5.0  | 1 | 15  | 50        | 250 | 0.008 | 0.11 |
| 532 | 1.17 | 1 | 300 | 41 by 580 | 6.3 | 0.20  | 0.58 |

The data generated in this example illustrates observed characteristics of the output laser beam including the wavelength, pulse energy averaged over the full beam area, the pulse duration, the size of the focus on the material (a single size value is indicitive of a circular spot, and dual values are indicative of the size of the minor and major axis of an elliptical spot), the energy density, and the maximum cutting speed for full penetration through the material. Also shown is the maximum cutting rate per average watt of applied laser power to facilitate comparison. The first three rows in Table 1 are data obtained for a frequency tripled Nd:YAG laser output. The improvement in cutting rate is readily apparent at low energy density as provided by the elliptical spot. The last two rows are cut data for a frequency doubled Nd:YAG laser output which also shows improved cutting rate for low energy density provided by the elliptical spot.

EXAMPLE 2

Silicon and Gallium Arsenide wafers were also cut using the system of the present invention. The wafers cut were approximately 0.64 mm thick and 0.25 mm thick for Si and GaAs, respectively. These wafers were cut at a wavelength of 355 nm. The laser pulse energy, duration, and repetition rate were 1.33 mJ, 1 nsec, and 300 Hz, respectively. The pulses were focused into an ellipse-shaped spot on the material surface with major axis about 0.75 mm and a minor axis about 0.036 mm. The cutting rate per average watt was found to be approximately 0.35 and 0.23 mm/sec/W for Si and GaAs wafers, respectively. Helium gas flushing at a rate of approximately 3 liters per minute was used during the cutting operation.

The above examples illustrate laser cutting of several semiconductor substrates. Many other types of substrates also can be cut in accordance with the apparatus and method of the present invention. These include, for example, ceramics, green tape, carbides, metals, polymers, glasses, silicas, crystals, and plastics among others, and various combinations of these materials or laminates of two or more of these materials. Generally, these substrates will be shaped as sheets with a thickness of up to about 5 mm. Alternatively, the substrates could be in other shapes and sizes. Although only through cuts have been discussed, the method and apparatus can be used to generate blind or non-through cuts in any target material. These cuts may be as deep as 5 mm.

Thus it is seen that an apparatus and method for forming though-cuts in a target material are provided. Although the invention has been described in with reference to certain preferred embodiments, one skilled in the art will appreciate that the present invention can be practiced by other than the preferred embodiments, which are presented in this description for purposes of illustration not limitation. Therefore, the spirit and scope of the appended claims should not be limited to the description of the preferred embodiments illustrated herein. It is noted that equivalents for the particular embodiments discussed in this description may practice the invention as well.

What is claimed is:

1. A method for laser cutting a target material comprising:
   generating laser pulses from a laser system—the laser pulses having a spot shape—the spot shape having a major axis and a minor axis, the major axis being substantially longer than the minor axis; and
   applying the laser pulses in a cutting direction along the major axis to the target material so that the laser pulses cut through the target material via laser ablation.

2. The method of claim 1 wherein:
   the laser pulses have a repetition rate greater than about 50 Hz.

3. The method of claim 2 wherein:
   the laser pulses have a repetition rate between about 100 and about 1500 Hz.

4. The method of claim 2 wherein:
   the spot includes a major axis and a minor axis, and
   the laser pulses are applied to the material such that the major axis of the spot moves parallel to the cutting direction.

5. The method of claim 4 wherein:
   the spot has a leading edge and a trailing edge on the major axis, and
   the energy density of each laser pulse increases from zero to a maximum along the leading edge and decreases back to zero along the trailing edge.

6. The method of claim 5 wherein:
   the ratio of the major axis to the minor axis of the spot is 4 or greater.

7. The method of claim 5 wherein:
   the length of the minor axis of spot is less than about 125 micrometers.

8. The method of claim 1 wherein:
   the temporal pulse width of the pulses is greater than about 2 nanoseconds and the laser pulses have a wavelength less than about 400 nanometers.

9. The method of claim 1 wherein:
   the temporal pulse width of the pulses is between about 100 picoseconds and about 2 nanoseconds and the laser pulses have a wavelength less than about 600 nanometers.

10. The method of claim 1 wherein:
the temporal pulse width of the pulses is less than about 100 picoseconds and the laser pulses have a wavelength less than about 1100 nanometers.

11. The method of claim 1 wherein:
the temporal pulse width of the pulses is shorter than about 40 nanoseconds.

12. The method of claim 1 wherein:
the temporal pulse width of the pulses is shorter than about 2 nanoseconds.

13. The method of claim 1 wherein:
the pulse energy of the laser pulses is selected, based on the ablation threshold energy density of the target material and the area of the spot, to be greater than about 5 microJoules.

14. The method of claim 13 wherein:
the pulse energy of the laser pulses is between about 0.1 milliJoules and about 250 milliJoules.

15. The method of claim 1 wherein:
the target material comprises a substrate including semiconductor dies.

16. The method of claim 15 wherein:
the spot includes a major axis and a minor axis, and
the laser pulses are applied to the material such that the major axis of the spot moves parallel to the cutting direction, and
the length of the major axis of the spot is less than about 2 centimeters.

17. The method of claim 1, the laser pulses having a temporal pulse width shorter than about 100 nanoseconds and having an energy density from about 2 to about 20 times an ablation threshold energy density of the target material.

18. The method of claim 1, wherein the laser system is for cutting a target material, the laser system comprising:
a seed laser system for producing a first pulse laser beam;
a laser amplifier for amplifying the first pulse laser beam to produce an amplified pulse laser beam;
a harmonic generation system for converting the amplified pulse laser beam into a second pulse laser beam having a shorter wavelength;
a focussing system for focussing the second pulse laser beam to an approximately ellipse shaped third pulse laser beam; and
a motion control system for moving a target material contacted by the third pulse laser beam.

19. The method of claim 18, wherein the focussing system comprises a first lens and a second lens, the first lens controlling the length of the major axis of the approximately ellipse shaped third pulse laser beam and the second lens controlling the length of the minor axis of the approximately ellipse shaped third pulse laser beam.

20. The method of claim 19 wherein the first lens and the second lens are cylindrical and are aligned at substantially 90 degrees.

21. The method of claim 19 wherein the motion control system comprises two orthogonal stages capable of moving the target material in any direction parallel to a surface plane of target material.

22. The laser system of claim 19 wherein the seed laser system comprises:
a laser crystal;
an optical pump arranged to pump the laser crystal;
at least two mirror surfaces defining a resonator, the resonator defining a beam path which transits the laser crystal;
an acousto-optic Q-switch installed within the beam path for blocking passage of light in the beam path except for short periods of time, the first optical shutter defining an ON period and an OFF period;
an acousto-optic mode locker installed within the resonator for blocking the passage of light in the resonator except for periodic sub nanosecond intervals, the intervals being spaced such that during each ON period a light pulse traveling at the speed of light in the resonator is able to make a plurality of transits through the resonator, increasing in intensity on each transit to defined an intensified pulse; and
a cavity dump for periodically releasing intensified pulses from the resonator, the periodically released intensified pulses defining the first pulse laser beam.

23. The method of claim 22 wherein the optical pump comprises a laser diode.

24. The method of claim 23 wherein the laser crystal is a Nd:YAG crystal.

25. The method of claim 19 wherein the laser amplifier comprises a laser diode pumped Nd:YAG rod.

26. The method of claim 25 wherein the laser amplifier is configured to provide for multiple passes of the first pulse laser beam through the Nd:YAG rod.

27. The method of claim 19 wherein the harmonic generation system comprises at least one non-linear crystal for converting the amplified pulse laser beam into a second pulse laser beam having a wavelength equal to 1/n times the wavelength of the amplified pulse laser beam, where n is an integer greater than 1.

28. The method of claim 18 wherein the motion control system comprises two orthogonal stages capable of moving the target material in any direction parallel to a surface plane of the target material.

29. The method of claim 28 wherein the motion control system further comprises a controller for controlling the speed and direction of movement of each of the orthogonal stages.

30. The method of claim 28 wherein the motion control system further comprises a vision system for aligning the major axis of the third pulse laser beam to at least one fiduciary point on th target material.

31. The method of claim 28 wherein the orthogonal stages move the target material in a direction parallel to the major axis of the third pulse laser beam.

32. The method of claim 1, wherein the laser pulses have a repetition rate of about or less than 15 Hz.

33. The method of claim 1, wherein the laser pulses have a repetition rate of about or less than 60 Hz.

34. The method of claim 1, wherein the laser pulses have a repetition rate of about or less than 300 Hz.

35. The method of claim 1, wherein the target material is a multi-layer laminate substrate containing ball grid array semiconductor elements.

36. The method of claim 35, wherein the substrate consists of three layers, wherein one layer is a polyamide layer that is about 50 micrometers thick, wherein a second layer is an intermittent copper layer that is about 20 micrometers thick, and wherein a third layer is an elastomeric epoxy layer between 250 and 580 micrometers in thickness.

37. The method of claim 1, wherein the target material is a silicon wafer.

38. The method of claims 37, wherein the wafer is about 0.64 mm thick.

39. The method of claim 1, wherein the target material is a gallium arsenide wafer.

40. The method of claim 39, wherein the wafer is about 0.25 mm thick.

* * * * *